United States Patent
Boo et al.

(10) Patent No.: US 6,709,920 B2
(45) Date of Patent: Mar. 23, 2004

(54) METHOD OF FABRICATING A NON-VOLATILE MEMORY DEVICE HAVING A TUNNEL-INSULATING LAYER INCLUDING MORE THAN TWO PORTIONS OF DIFFERENT THICKNESS

(75) Inventors: Jae-Phil Boo, Suwon-shi (KR);
Soo-Young Tak, Suwon-shi (KR);
Kwang-Bok Kim, Gapyeong-gun (KR);
Kyung-Hyun Kim, Seoul (KR);
Chang-Ki Hong, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/902,243

(22) Filed: Jul. 10, 2001

(65) Prior Publication Data

US 2002/0016041 A1 Feb. 7, 2002

(30) Foreign Application Priority Data

Jul. 11, 2000 (KR) ........................ 2000-39609

(51) Int. Cl.[7] .......................... H01L 21/8242
(52) U.S. Cl. .................. 438/257; 438/258; 438/424
(58) Field of Search ................ 438/424, 257, 438/258

(56) References Cited

U.S. PATENT DOCUMENTS 6,034,393 A * 3/2000 Sakamoto et al.
6,150,273 A * 11/2000 Liu et al.
6,222,225 B1 * 4/2001 Nakamura et al.
6,248,641 B1 * 6/2001 Liu et al.
6,309,928 B1 * 10/2001 Sung et al.
6,326,263 B1 * 12/2001 Hsieh

* cited by examiner

Primary Examiner—Long Pham
(74) Attorney, Agent, or Firm—Mills & Onello LLP

(57) ABSTRACT

A method of fabricating a non-volatile memory device, which has a tunnel insulating layer consisting of two or more portions of different thickness, cell transistors, and auxiliary transistors for applying external voltage and for interfacing with peripheral circuits is described. According to the method, the tunnel insulating layer, a conductive layer, and a first insulating layer are sequentially deposited over a semiconductor substrate. The resultant structure is selectively etched to a given depth to form trenches. A second insulating layer is deposited over the substrate including the trenches, and the second insulating layer is selectively removed so as to form element isolation regions consisting of the trenches filled with the second insulating layer. The first insulating layer is selectively removed, and the second insulating layer is selectively removed by a CMP process to expose the conductive layer. The conductive layer is used as the stopping layer during the CMP process.

8 Claims, 6 Drawing Sheets

METHOD OF FABRICATING A NON-VOLATILE MEMORY DEVICE HAVING A TUNNEL-INSULATING LAYER INCLUDING MORE THAN TWO PORTIONS OF DIFFERENT THICKNESS

BACKGROUND OF THE INVENTION

1. Field of the Invention

The present invention relates to a semiconductor memory device, and more particularly to a method of fabricating a non-volatile memory device having a tunnel-insulating layer including more than two parts of different thickness suitable for diminishing irregular thickness of the field oxide layer.

2. Description of the Related Art

Non-volatile memory devices such as flash EEPROMs (Electrically Erasable Programmable Read Only Memory) and flash memory cards are recently finding many uses. One very important issue associated with the use of non-volatile semiconductor memory devices, such as in mass storage media, is a high cost per bit of storage. In addition, the memory chip should have low power consumption to be used for portable instruments. Recently, there has been much effort to develop the multi-bit per cell memory. In a multi-bit per cell (hereinafter referred to as multi-bit cell) more than one bit is stored in a single cell to enhance the storage capacity, compared to the cells of the conventional nonvolatile memory devices, in which each cell corresponds to a single bit of data.

The multi-bit cell requires three or more threshold voltage levels to be programmed in each memory cell. For example, in order to store two bits in each cell, the number of the threshold voltage levels should be $2^2=4$. In this case, the four levels are made to respectively correspond to the logic states 00, 01, 10, and 11. In such multi-level programming, each threshold voltage level has a statistical distribution of about 0.5V. Accordingly, as each threshold level is precisely adjusted to reduce its distribution range, the number of the threshold levels is increased, and so is the number of data bits stored in each cell. One of the methods for reducing such threshold level distribution is to alternately repeat the steps of programming and verifying. That is, while a series of programming voltage pulses is applied to the non-volatile memory cell to be programmed with desired threshold levels, reading is performed between the series of voltage pulses in order to verify that the cell has reached the desired levels. If the verification shows that each level has been reached, the programming is stopped. However, such a method cannot readily reduce the error distributions of the threshold levels due to the limited pulse widths of the programming voltage. Moreover, the algorithm for repeatedly alternating programming and verifying requires an additional circuit which increases the size of the peripheral circuit region. Further, the alternate repetition of programming and verifying increases the programming time. The cell size and cell array structure generally affect the effective cell size of the memory cell determining the integration scale of a non-volatile memory device such as EEPROM or flash EEPROM.

FIGS. 1A and 1B illustrate respectively both circuit diagram and cross sectional view of the fundamental cell structure of a non-volatile memory device composed of deposited layers. Referring to FIG. 1A, the circuit diagram of the memory cell shows a control gate 5, floating gate 3, source 6a, channel region 7, and drain 6b. When a program voltage is applied to the control gate 5 and drain 6b, a current flows between the drain 6b and source 6a. If the amount of the current flowing is equal to or less than that of the reference current, there is generated the programming completion signal. Referring to FIG. 1B, deposited over a p-type semiconductor substrate 1 is a floating gate 3 with a tunnel oxide layer 2 interposed between them. The control gate 5 is deposited over the floating gate 3 with a dielectric layer 4 between them. The n-type source and drain regions 6a and 6b are respectively formed at both sides of the floating gate 3 in the p-type semiconductor substrate 1.

Although the effective cell size of such a non-volatile memory device simply deposited is small, the coupling constant of the control gate 5 has a small value, being additionally smaller when reducing the effective cell size. In order to resolve this, an ONO (oxide-nitride-oxide) layer is used for the dielectric layer 4 between the floating gate 3 and control gate 5. This ONO layer, together with a required additional annealing process, complicates the fabrication process.

The non-volatile memory device comprises the cell transistors for storing information, and the auxiliary transistors both for applying the external voltage and for interfacing with peripheral circuits. Accordingly, the tunnel insulating layer 2 below the floating gate 3 is different for a low voltage transistor and a high voltage transistor.

A conventional method of fabricating a non-volatile memory device having a tunnel insulating layer consisting of two portions of different thickness will now be described in connection with FIGS. 2A to 2D. Referring FIG. 2A, sequentially deposited over a semiconductor substrate 21 are a tunnel insulating layer 22 consisting of two portions of different thickness. A conductive layer 23 is formed over the tunnel insulating layer, and a first insulating layer 24 is formed over the conductive layer 23. Then, a photoresist layer is deposited over the first insulating layer 24. The photoresist layer is exposed and developed to generate a photoresist patter PR1. In this case, the first insulating layer 24 may be a nitride layer.

Referring to FIG. 2B, the photoresist pattern PR1 is used as a mask to sequentially selectively etch the first insulating layer 24, conductive layer 23, tunnel insulating layer 22, and semiconductor substrate 21 through self-alignment to form trenches. Then, a second insulating layer 25 is deposited over the substrate including the trenches. In this case, the second insulating layer 25 may be achieved by using HDP (High Density Plasma). Subsequently, CMP (Chemical Mechanical Polishing) is performed to flatten the upper surface of the resultant structure as shown in FIG. 2C. The HDP layer 25 is selectively etched through photolithography then subjected to CMP to form element isolation regions with HDP layer 25 contained only in the trenches.

When using such a structure in the formation of a high voltage transistor and a low voltage transistor, the step between the high voltage transistor and the element isolation region forms a dielectric difference with the step between the low voltage transistor and the element isolation region because of the thickness difference between the high and low voltage portions of the tunnel insulating layers. Such a thickness difference of the tunnel-insulating layer adversely affects the flattening of the HDP layer after CMP. Then, removing the first insulating layer 24 from the floating gate 23 by means of a wet etching process as shown in FIG. 2D, a dielectric layer (not shown) is deposited over the floating gate 23, over which the control gate is formed. In this case, the second insulating layer 25 produces a negative slope in the element isolation region, so that the subsequent etching process of the control gate cannot completely remove the conductive layer, thus producing stringers.

Therefore, the conventional non-volatile memory device having a tunnel-insulating layer consisting of two or more portions of different thickness inherently suffers from several drawbacks. For example, when flattening the element isolation regions through the CMP process, the step difference between the floating gate and element isolation regions may cause failure of the subsequent contact opening, short circuit between the gates due to the fine residue remaining in the gates, or humped transistor. In addition, if the step between the floating gate and element isolation region is high, the thickness of the nitride layer serving as the stopping layer is increased so as to reduce the contact etching margin, which causes failure of the contact opening. Moreover, the property of the insulating layer, e.g., HDP layer, used for the element isolation causes the negative slope in the element isolation regions, so that the subsequent etching process cannot completely etch the control gate. In order to reduce the negative slope, an additional wet etching process is used to diminish the insulating layer in the element isolation regions, which complicates the fabrication process. Alternatively, if the step between the floating gate and the element isolation region is small, the insulating layer in the element isolation region contacts the tunnel-insulating layer causing a humped transistor.

SUMMARY OF THE INVENTION

It is an object of the present invention to provide a method of fabricating a non-volatile memory device having a tunnel-insulating layer consisting of more than two parts of different thickness suitable for reducing the step between the floating gate and the insulating layer of the element isolation region.

The invention is directed to a method of fabricating a non-volatile memory device, which has a tunnel insulating layer consisting of two or more portions of different thickness, cell transistors, and auxiliary transistors for applying external voltage and for interfacing with peripheral circuits. In accordance with the method, the tunnel insulating layer, a conductive layer, and a first insulating layer are sequentially deposited over a semiconductor substrate. The resultant structure is selectively etched to a given depth to form trenches. A second insulating layer is deposited over the structure including the trenches. The second insulating layer is selectively removed so as to form element isolation regions consisting of the trenches filled with the second insulating layer. The first insulating layer is removed, and the second insulating layer is selectively removed by a CMP process until the conductive layer is exposed, the conductive layer being used as the stopping layer for the CMP process.

In one embodiment, the conductive layer serves as a floating gate in a transistor device formed as part of a memory cell in the memory device.

The conductive layer can have a thickness of between 50 and 1000 Å. The first insulating layer can be formed of a material selected from the group consisting of SiN, BN and CN. The first insulating layer can have a thickness between 100 and 1000 Å. The second insulating layer can be formed of a material selected from the group consisting of HDP, BPSG, SOG, Fox, USG, HOSP, and black diamond.

In one embodiment, selectively removing the second insulating layer by the CMP process employs a slurry with selectivity between said second insulating layer and the conductive layer equal to or greater than 1.

In one embodiment, selectively removing the second insulating layer includes subjecting the structure to photolithography to selectively etch the second insulating layer. The first and second insulating layers are flattened through a CMP process. Photolithography is performed to selectively remove the flattened first insulating layer. The second insulating layer is subjected to a CMP process to complete the element isolation regions. Selectively removing the flattened first insulating layer can be performed until the conductive layer is exposed.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1A:
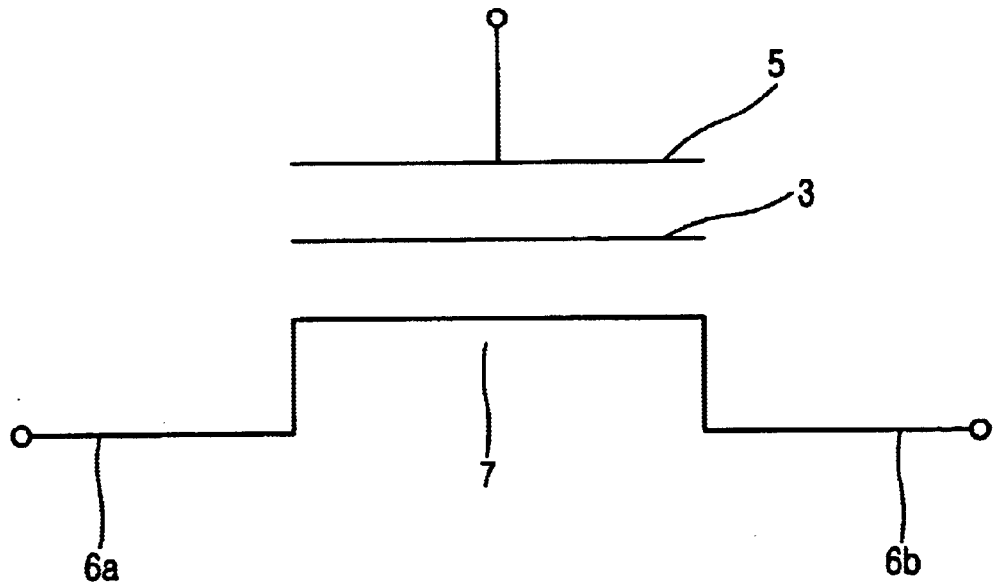
FIG. 1A is a schematic circuit diagram of a cell of a conventional non-volatile memory device.
Figure 1B:
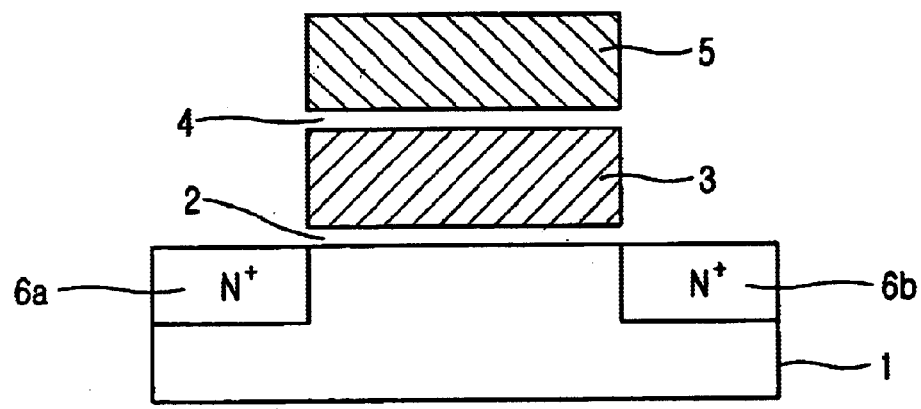
FIG. 1B is a cross-sectional view for illustrating the cell structure of the conventional non-volatile memory device of a simple deposition type.
Figure 2A:
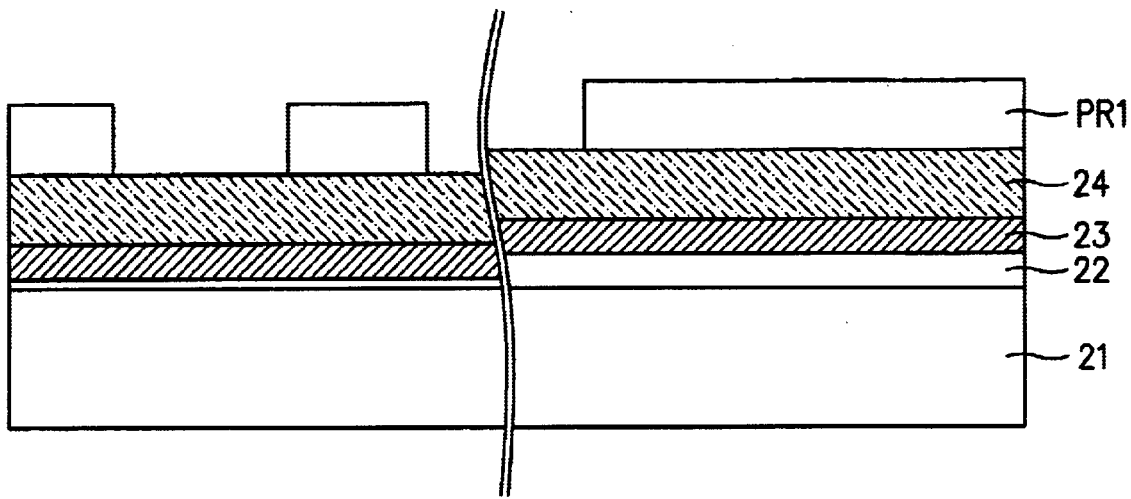
FIGS. 2A to 2D are cross-sectional views for illustrating the conventional process of fabricating a non-volatile memory device having a tunnel insulating layer consisting of two or more portions of different thickness.
Figure 2B:
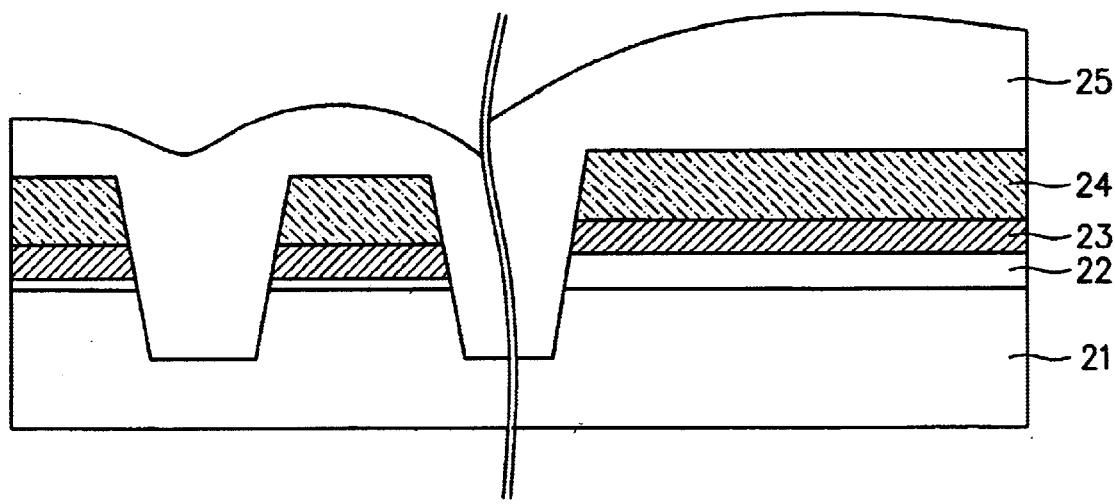
Figure 2C:
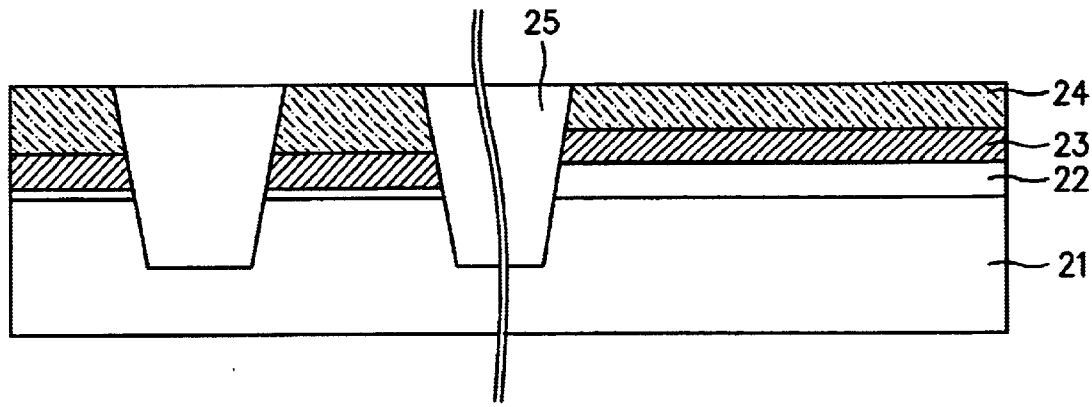
Figure 2D:
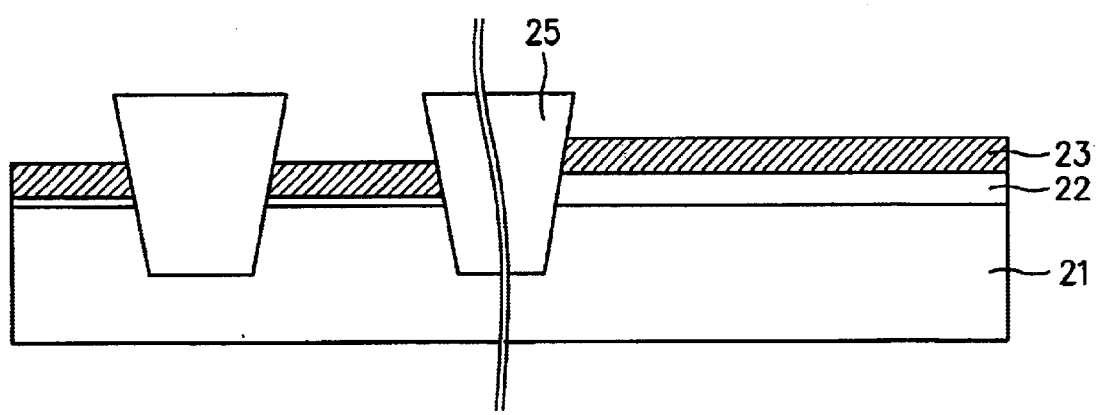
Figure 3A:
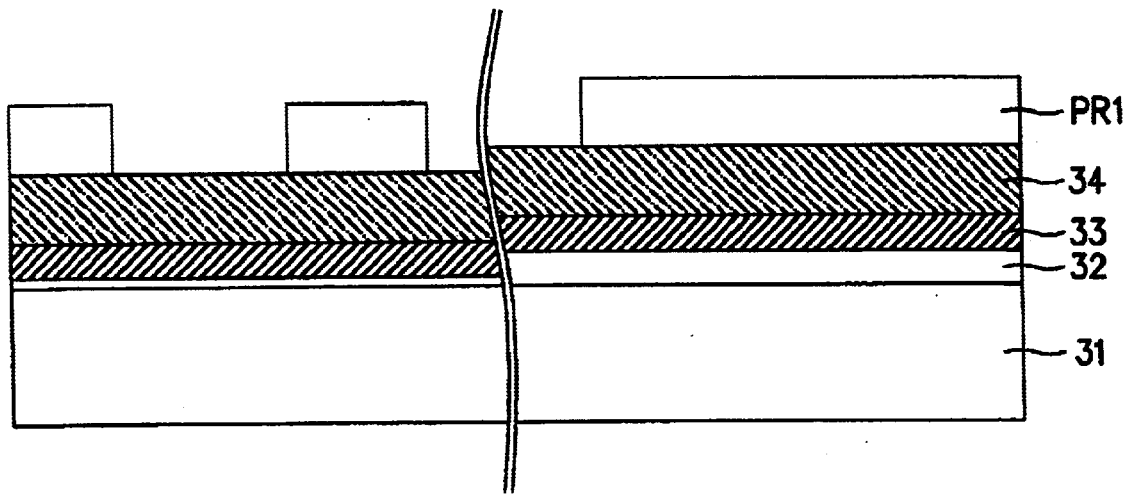
FIGS. 3A to 3E are cross-sectional views illustrating one embodiment of a process of fabricating a non-volatile memory device having a tunnel insulating layer consisting of two or more portions of different thickness, in accordance with the invention.

Referring to FIG. 3A, sequentially deposited over a semiconductor substrate 31 with cell regions and peripheral circuit regions are a tunnel insulating layer 32 with portions of different thickness, conductive layer 33, and first insulating layer 34. Then, a photoresist layer is deposited over the first insulating layer 34. The photoresist layer is selectively exposed and developed to generate a photoresist pattern PR1. In this case, the conductive layer 33 can have a thickness of 50 to 1000 Å, and the first insulating layer 34 may consist of SiN, BN, or CN with a thickness of 100 to 1000 Å.

Figure 3B:
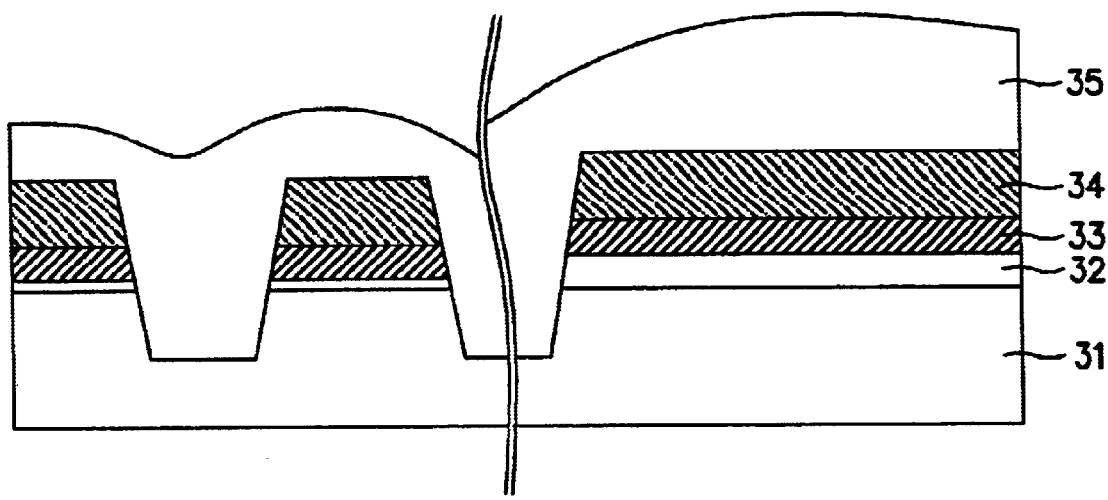

As shown in FIG. 3B, sequentially and selectively etched through a self-align process are the first insulating layer 34, conductive layer 33, tunnel insulating layer 32, and semiconductor substrate 31 in order to form trenches. The conductive layer 33 is to be used as a floating gate layer for the memory device of the invention. Then, a second insulating layer 35 is deposited over the substrate including the trenches by using HDP, BPSG, SOG, Fox, USG, HOSP, or black diamond.

Figure 3C:
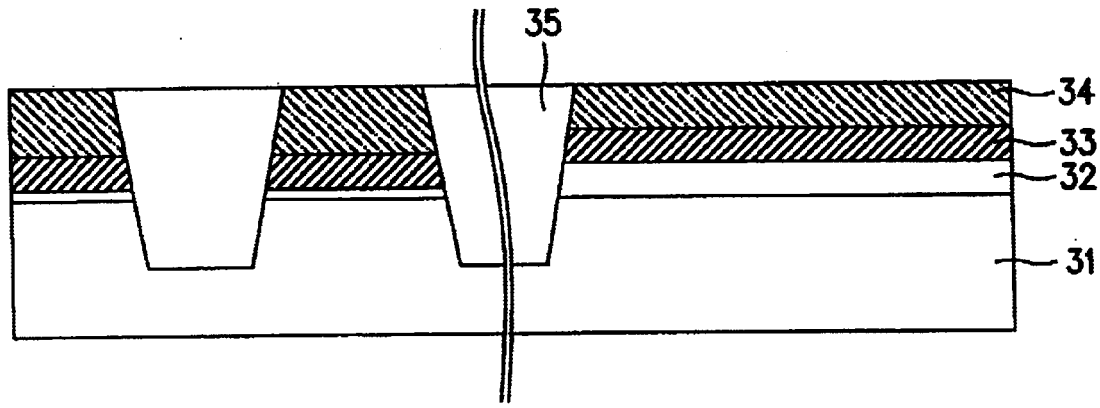

Then, the upper surface of the resultant structure is flattened through a CMP process, as shown in FIG. 3C. Subsequently, the second insulating layer 35 is selectively etched through photolithography. Thereafter, the upper surface of the substrate is subjected to CMP process so that the trenches only are filled with the second insulating layer 35, forming element isolation regions.

Figure 3D:
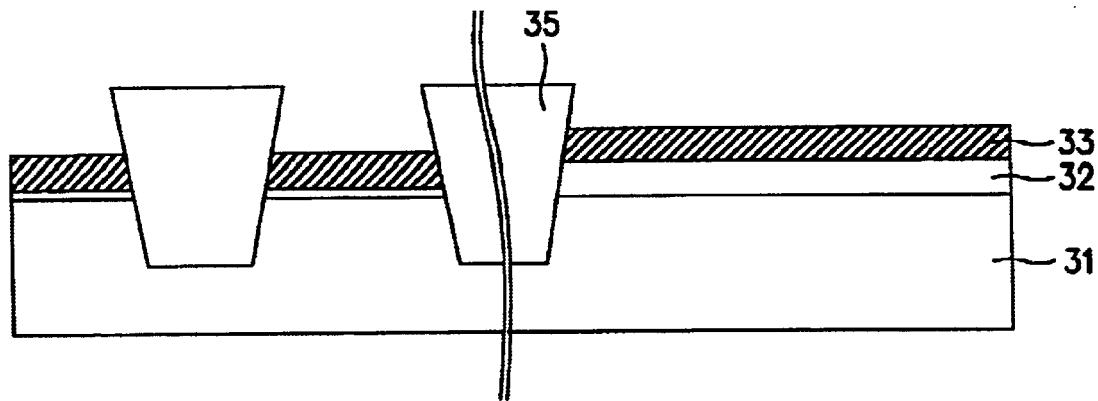
Figure 3E:
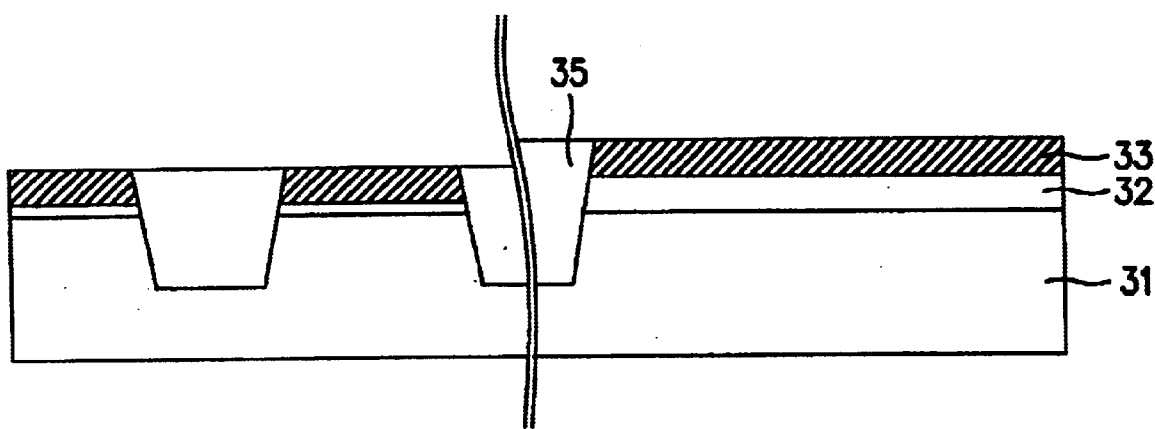

Subsequently, wet etching is performed to remove the first insulating layer 34 from the conductive or floating gate layer 33, as shown in FIG. 3D. The wet etching can be performed using phosphoric acid. Next, the top portion of the second insulating layer 35 which extends above the surface of the conductive floating gate layer 33 is removed by CMP, as shown in FIG. 3E. The CMP is performed using a slurry with selectivity between the second insulating layer 35 and the conductive or floating gate layer 33 equal to or greater than 1. The floating gate layer 33 serves as the stopping layer during the CMP process used to remove the second insulating layer 35. Finally, deposited over the floating gate 33 is a dielectric layer (not shown), on which the control gate is formed to complete a non-volatile memory device.

Thus, the invention eliminates the humped transistor caused by reduction of the insulating layer in the trench by means of the CMP process using the floating gate as the stopping layer. In addition, the high stepped region unavoidably formed between the floating gate and the insulating layer in the trench in the conventional process is significantly diminished, solving the problem that the subsequent process could not readily have opened the contact. Additionally, when performing wet etching to etch the insulating layer, the floating gate is utilized as the stopping layer, thus converting the negative slope of the edges of the element isolation region into somewhat positive slope, and therefore, the fine residues occurring in the conventional method are eliminated.

While the present invention has been described in connection with specific embodiments accompanied by the attached drawings, it will be readily apparent to those skilled in the art that various changes and modifications may be made thereto without departing from the spirit and scope of the present invention.

What is claimed is:

1. A method of fabricating a non-volatile memory device having a tunnel insulating layer, comprising:

sequentially depositing said tunnel insulating layer, a floating gate conductive layer, and a first insulating layer over a semiconductor substrate, said tunnel insulating layer including at least two portions of different thicknesses, and said conductive layer serving as a floating gate in a transistor device formed as part of a memory cell in the memory device;

selectively etching the resultant structure to a given depth to form trenches; depositing a second insulating layer over said structure including said trenches; selectively removing said second insulating layer so as to form element isolation regions composed of the trenches filled with said second insulating layer;

removing said first insulating layer; and selectively removing said second insulating layer using a chemical mechanical polishing (CMP) process until a surface of the floating gate conductive layer is substantially even with a surface of the second insulating layer, the floating gate conductive layer being used as a stopping layer for the CMP process.

2. A method as defined in claim 1, wherein said floating gate conductive layer has a thickness of 50 to 1000 Å.

3. A method as defined in claim 1, wherein said first insulating layer is formed of a material selected from the group consisting of SiN, BN, and CN.

4. A method as defined in claim 1, wherein said first insulating layer has a thickness of 100 to 1000 Å.

5. A method as defined in claim 1, wherein the step of selectively removing said second insulating layer comprises:

subjecting said structure to photolithography to selectively etch said second insulating layer;

flattening said first and second insulating layers through a CMP process;

performing photolithography to selectively remove the flattened first insulating layer; and subjecting said second insulating layer to a CMP process to complete said element isolation regions.

6. A method as defined in claim 5, wherein the step of selectively removing said flattened first insulating layer is performed until said floating gate conductive layer is exposed.

7. A method as defined in claim 1, wherein said second insulating layer is formed of a material selected from the group consisting of HDP, BPSG, SOG, Fox, USG, HOSP, and black diamond.

8. A method as defined in claim 1, wherein the step of selectively removing said second insulating layer by the CMP process employs a slurry with selectivity between said second insulating layer and the floating gate conductive layer equal to or greater than 1.

* * * * *